United States Patent
Cox et al.

(10) Patent No.: US 7,797,661 B2
(45) Date of Patent: Sep. 14, 2010

(54) METHOD AND APPARATUS FOR DESCRIBING AND MANAGING PROPERTIES OF A TRANSFORMER COIL

(75) Inventors: David N. Cox, Raleigh, NC (US); Thomas J Lanoue, Cary, NC (US)

(73) Assignee: ABB Research AG, Zurich (CH)

( * ) Notice: Subject to any disclaimer, the term of this patent is extended or adjusted under 35 U.S.C. 154(b) by 489 days.

(21) Appl. No.: 11/635,929

(22) Filed: Dec. 8, 2006

(65) Prior Publication Data
US 2007/0234263 A1 Oct. 4, 2007

Related U.S. Application Data

(63) Continuation-in-part of application No. 10/933,535, filed on Sep. 3, 2004, now Pat. No. 7,263,672.

(51) Int. Cl.
G06F 17/50 (2006.01)
G06F 9/455 (2006.01)
G06F 17/28 (2006.01)

(52) U.S. Cl. ............... 716/11; 716/1; 716/2; 716/8; 716/9; 716/10; 715/234

(58) Field of Classification Search ............ 715/1, 715/2, 8, 234; 707/100; 716/1, 2, 8; 717/104, 717/174
See application file for complete search history.

(56) References Cited

U.S. PATENT DOCUMENTS

| | | | |
|---|---|---|---|
| 4,986,124 A | 1/1991 | Byrne et al. | |
| 6,211,766 B1 | 4/2001 | Goseberg et al. | |
| 6,239,557 B1 | 5/2001 | Chang et al. | |
| 6,473,139 B1 | 10/2002 | George | |
| 6,516,451 B1 | 2/2003 | Patin | |
| 6,606,731 B1 | 8/2003 | Baum et al. | |
| 6,961,918 B2 * | 11/2005 | Garner et al. | 716/18 |
| 7,168,035 B1 * | 1/2007 | Bell et al. | 715/234 |

(Continued)

FOREIGN PATENT DOCUMENTS

EP 0991092 4/2000

(Continued)

OTHER PUBLICATIONS

Marino et al.; "Creating an abstraction of sensors to ease usage, distribution and management of a measurement network"; Sep. 16-19, 2003; Emerging Technologies and Factory Automation, 2003. Proceedings. ETFA '03. IEEE Conference vol. 2, pp. 471-478 vol. 2.*

(Continued)

Primary Examiner—Helen Rossoshek
(74) Attorney, Agent, or Firm—GDS Legal Dept.; Paul Katterle

(57) ABSTRACT

A method and apparatus for describing and managing properties of a transformer coil. A metadata text file is generated which contains metadata describing objects of the transformer coil. The objects are arranged hierarchically and have one or more related properties attached therewith. One or more properties of one object refer to one or more other properties of the same object or of other objects by means of paths defined in the metadata text file. The generated metadata text file is then stored.

15 Claims, 7 Drawing Sheets

U.S. PATENT DOCUMENTS

| | | | |
|---|---|---|---|
| 7,263,672 B2 | 8/2007 | Cox et al. | |
| 7,421,648 B1 * | 9/2008 | Davis | 715/234 |
| 7,475,000 B2 * | 1/2009 | Cook et al. | 703/14 |
| 2002/0156929 A1 | 10/2002 | Hekmatpour | |
| 2003/0208365 A1 * | 11/2003 | Avery et al. | 705/1 |
| 2004/0007994 A1 * | 1/2004 | Ribarich et al. | 315/307 |
| 2004/0060014 A1 | 3/2004 | Khalil | |
| 2004/0172603 A1 | 9/2004 | Collmeyer et al. | |
| 2004/0207487 A1 | 10/2004 | Hayashi | |
| 2004/0220791 A1 * | 11/2004 | Lamkin et al. | 703/11 |
| 2005/0080502 A1 | 4/2005 | Chernyak et al. | |
| 2005/0096772 A1 | 5/2005 | Cox et al. | |
| 2005/0096774 A1 * | 5/2005 | Bayoumi et al. | 700/109 |
| 2005/0096886 A1 | 5/2005 | Smiley et al. | |
| 2005/0193361 A1 | 9/2005 | Vitanov et al. | |
| 2005/0278670 A1 | 12/2005 | Brooks et al. | |
| 2005/0289484 A1 | 12/2005 | Whitefoot et al. | |
| 2006/0053398 A1 | 3/2006 | Cox et al. | |
| 2006/0064667 A1 | 3/2006 | Freitas | |
| 2006/0085781 A1 | 4/2006 | Rapp et al. | |
| 2006/0178864 A1 | 8/2006 | Khanijo et al. | |
| 2007/0027883 A1 * | 2/2007 | Cox et al. | 707/100 |
| 2007/0283309 A1 * | 12/2007 | Cox et al. | 716/11 |
| 2008/0244491 A1 * | 10/2008 | Ganesan et al. | 716/10 |

FOREIGN PATENT DOCUMENTS

| | | |
|---|---|---|
| WO | 2007025153 | 7/2007 |

OTHER PUBLICATIONS

Micheal Steurer, "The Impact of Inrush Currents on the Mechanical Stress of High Voltage Power Transformer Coils" by, IEEE Transaction on Power Delivery, vol. 17, No. 1, Jan. 2002, pp. 155-160.

Marino et al.,; "Creating an Abstraction of Sensors to Ease Usage, Distribution and Management of a Measurement Network"; Sep. 16-19, 2003; Emerging Technologies and Factory Automation.

* cited by examiner

METHOD AND APPARATUS FOR DESCRIBING AND MANAGING PROPERTIES OF A TRANSFORMER COIL

CROSS REFERENCE TO RELATED APPLICATION

This application is a continuation-in-part of U.S. patent application Ser. No. 10/933,535 filed on Sep. 3, 2004, entitled "Methods, Systems, and Data Models For Describing an Electrical Device" (now U.S. Pat. No. 7,263,672), the contents of which are relied upon and incorporated herein by reference in their entirety, and the benefit of priority under 35 U.S.C. 120 is hereby claimed.

FIELD OF THE INVENTION

The present invention relates to a method and an apparatus for describing and managing properties of a transformer coil.

BACKGROUND OF THE INVENTION

As it is known, power and distribution transformers are industrial devices used to convert electrical energy from one voltage potential to another.

A transformer has two basic components, the core and the coil. The core is made from materials such as steel or iron and may have a single leg or multiple legs depending on the type of transformer. The coil of a transformer consists of conductive material, typically wire, wound around the leg(s) of the core.

At present, there are several types of transformer models available on the market and manufactured according to various customer specifications. For example, a utility company may need a transformer with a unique kVA rating that fits a particular footprint, customers may require that the same power transformer be able to produce different voltages, et cetera. In most cases, in order to achieve a desired performance it is necessary to change one or more properties of components of the transformer and this definitely requires to modify, partially or entirely, the design of the transformer.

One of the most difficult tasks in designing the transformer is designing the coil. The coils comprise phase circuits, and each phase circuit consists of one or more windings. In its simplest form, the coil of a transformer has a single primary winding and a single secondary winding. In a complex coil design, there may be multiple windings. In turn, each winding comprises one or more segments which in practice are electrical circuits connected to each other by nodes. Different numbers of segments are connected to achieve different voltages. In many cases a minimum of two segments are connected in series to achieve the minimum voltage and all the segments are connected in series to achieve the maximum voltage. Clearly, a request from a customer demanding a specific set of voltages to be produced by a transformer means to substantially revise if not to restart completely the design of an existing transformer model.

The same consequences more or less occur when changing any other property of the transformer in order to meet any requirement submitted by the customers.

Thus, in order to simplify the design process, designers make use more and more of automated tools and software programs. However, taking into account the huge variability of customer requirements and the number of components and properties of the transformer to be taken into account, it is still desirable to provide a solution which allows to further improve and optimize as much as possible the design process of transformer coils.

SUMMARY OF THE INVENTION

In accordance with the present invention, a method for describing and managing properties of a transformer coil, comprising:

generating a metadata text file which contains metadata describing objects of said transformer coil, wherein said objects are arranged hierarchically and have one or more related properties attached therewith, at least one property of one of said objects referring to one or more other properties of the same object or of other objects using paths defined in said metadata text file; and storing the generated metadata text file.

The present invention also provides a computer program product for describing and managing properties of a transformer coil, comprising a computer-readable medium having thereon computer usable program code configured to:

generate a metadata text file which contains metadata describing objects of said transformer coil, wherein said objects are arranged hierarchically and have one or more related properties attached therewith, at least one property of one of said objects referring to one or more other properties of the same object or of other objects using paths defined in said metadata text file; and store the generated metadata text file.

Further, the present invention provides a system for describing and managing properties of a transformer coil, comprising a computing device having therein program code configured to:

generate a metadata text file which contains metadata describing objects of said power transformer, wherein said objects are arranged hierarchically and have one or more related properties attached therewith, at least one property of one of said objects referring to one or more other properties of the same object or of other objects using paths defined in said metadata text file; and store the generated metadata text file.

BRIEF DESCRIPTION OF THE DRAWINGS

The features, aspects, and advantages of the present invention will become better understood with regard to the following description, appended claims, and accompanying drawings where:

DETAILED DESCRIPTION OF ILLUSTRATIVE EMBODIMENTS

It should be noted that in order to clearly and concisely disclose the present invention, the drawings may not necessarily be to scale and certain features of the invention may be shown in somewhat schematic form.

Exemplary embodiments of the present invention are directed to accurately defining and producing an electrical device in a manner which eliminates manual encoding by a programmer using a complex programming language. Methods, systems, and data models are employed to define a physical configuration (i.e., physical characteristics, such as the geometry of a physical layout and/or a circuit layout) of an electrical device. Metadata and a recursive data structure are used to produce a text file according to a metamarkup language, such as Extensible Markup Language ("XML"). Other metamarkup languages can be used to produce a text file.

Figure 6:
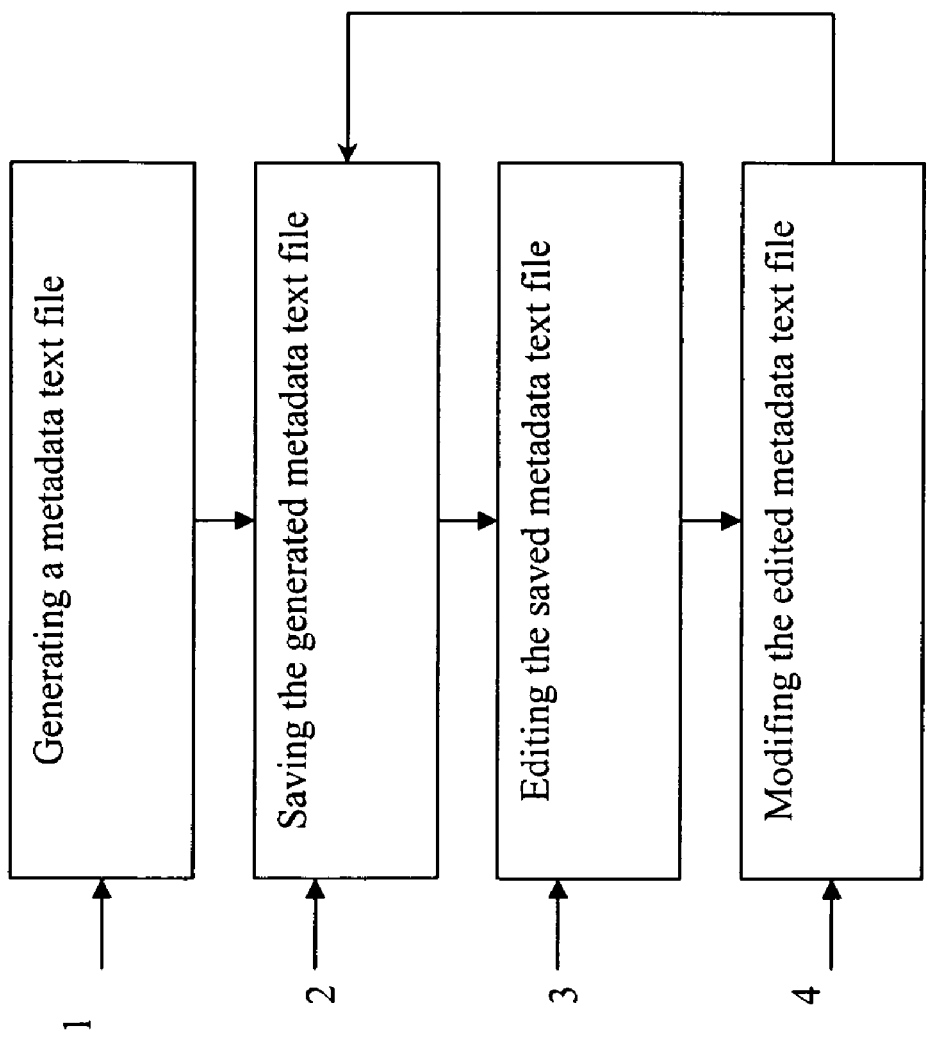
FIG. 6 is an exemplary flow diagram representing an embodiment of the method for describing and managing properties of a transformer coil according to the present invention.

As illustrated in FIG. 6, when designing a transformer coil the method for describing and managing properties of a transformer coil according to the present invention comprises a first phase 1 wherein a metadata text file which contains metadata describing objects of said transformer coil is generated. In particular, the objects which represent the components of the transformer coil are arranged hierarchically. One or more related properties are attached to corresponding objects of the coil with at least one property of one of said objects which refers to one or more other properties of the same object or of other objects. Such reference is advantageously realized by means of appropriate paths defined in the metadata text file.

Preferably the metadata text file comprises metadata describing at least one object of the group consisting of coil phase circuits, windings, segments, start leads, finish leads, circuits, nodes, sources, destinations, barriers, whereas the one or more properties attached to the various object comprises at least one property of the group consisting of voltage selector, BIL (Basic Insulation level), value selector, various voltage levels such as the nominal voltage (NV) or the maximum or minimum voltage, various current levels flowing through the coil and in particular through the segments, such as the maximum current (MaxAmps), the maximum serial current (MaxSerialAmps), or the maximum parallel current (MaxParallelAmps).

Clearly, some more properties could be added depending on the various applications.

Figure 7:
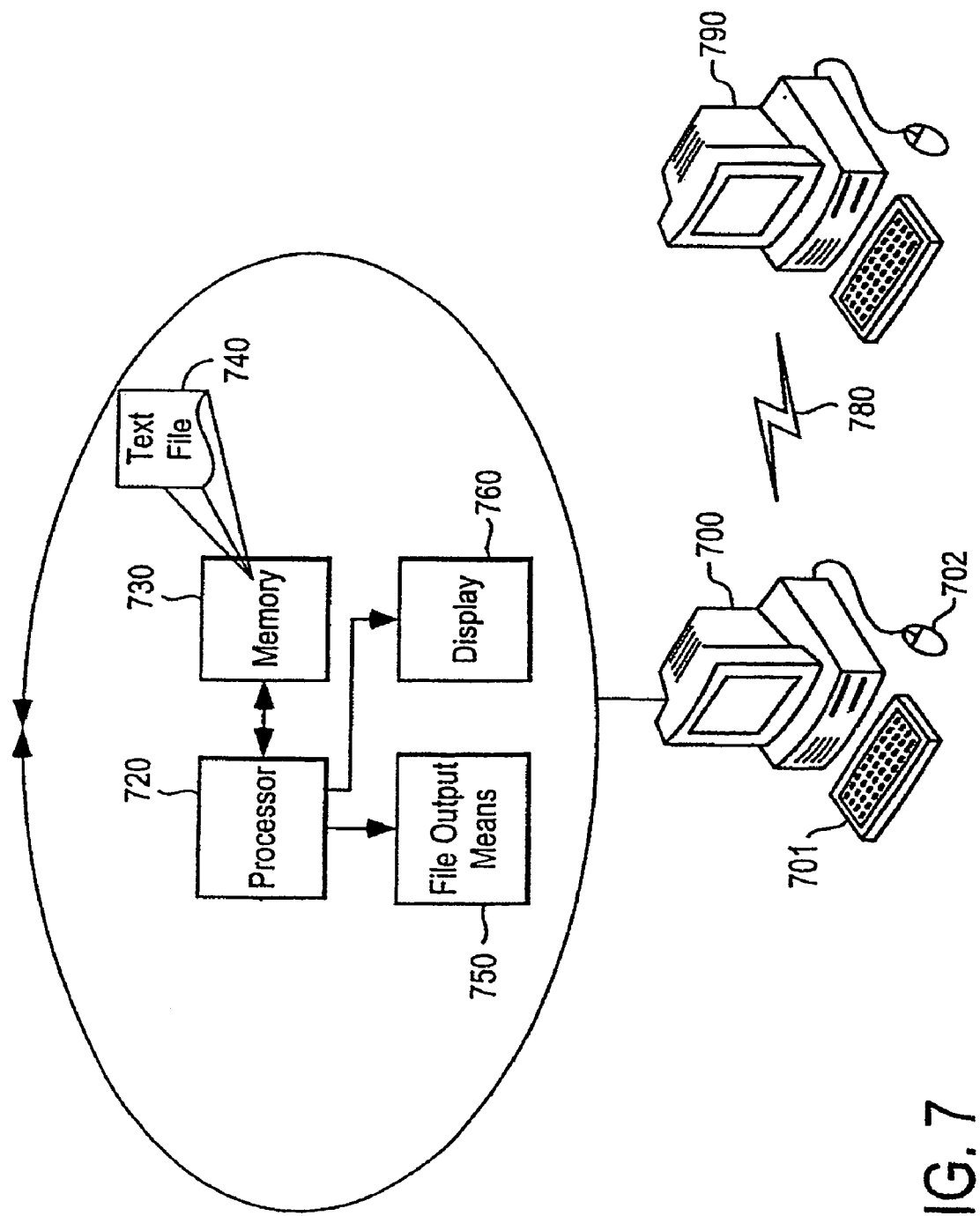
FIG. 7 illustrates an exemplary system for describing and managing properties of a transformer coil according to the present invention.

At phase 2, the generated metadata text file, schematically indicated in FIG. 7 by the reference number 740, is conveniently stored in any suitable storing unit, such as the one indicated in FIG. 7 by the reference number 730.

In this way the stored metadata text file constitutes a saved model template and by utilizing a hierarchically arranged data structure incorporating metadata the templates generated incorporate much less code with respect to traditional solutions and are easier to edit and understand than those based on standard programming languages. When needed, each transformer coil template is edited by a designer at phase 3 and at phase 4 is modified even at run time according to the specific needs. Thus, in order to carry out the required modifications, it would not be necessary to completely or substantially re-design the whole coil. The designer can modify the template directly from within the transformer design tool and since the modifications can be carried out by means of the design tool itself, the designer does not need to be an expert programmer. After modifying, the template can be saved again in the storing unit.

In the method according to the invention, when the metadata text file describing the transformer coil is built up, the designer can advantageously assign to one or more of the properties attached to the corresponding objects a numeric value, or a text value, or an equation. In particular, when an equation is assigned to a property, the method foresees the calculation of a value for this property by solving the equation assigned to the property itself. Further, the calculated value for this property is used as an input into another equation which can be assigned to another property attached to the same object or to a property attached to another object. This operation can be repeated in cascade.

Hence, in the method according to the invention, depending on the path defined by the designer the result of a calculation can be an intermediate result to be used as an input into another property, or as the final result which gives to the designer the needed calculation for the requested property. Further, through the paths defined by the designer, it is automatically determined where to send a result, i.e. to a part internal to the coil designed or to an external system in which case the property will be marked as an output property.

Preferably, the method according to the invention is used to calculate the number of turns of the windings, or one or more voltages produced by the windings or the level of current flowing through at least one of the segments. Other possible values can be calculated as well depending on the applications.

As it will be appreciated by any person having ordinary skill in the art, the software algorithm at the base of the method according to the invention, can be implemented in any suitable computing device or system and can be utilized as a stand alone component, or in connection or even integrated with any other software tool, such as a tool for designing electrical devices and in particular transformers.

One example of such design tools is the CDS (Common Design System) transformer design tool developed by ABB Inc.

An exemplary system for describing and managing properties of a transformer coil according to the present invention is depicted in FIG. 7. The system comprises a computer 700 which includes input means, such as a keyboard 701 and/or mouse 702. Processor means 720 are included for processing the data entered and for producing a metadata text file having metadata arranged in a hierarchical format and corresponding to the objects of the coil. Although a desktop computer 700 is shown for illustrative purposes, it should be understood that any device having a processor can be used, such as a laptop computer, a PDA, mobile station, and the like. The system also includes memory means 730 for storing the generated metadata text file 740. Display means 760 display a graphical representation of the transformer coil or part thereof. File output means 750 forward the metadata text file to an application for processing. The file output means 750 can output the text file 740 to an application within the same computer 700 or to an application in another computer 790 via a communication network 780, wired or wireless, such as a LAN, the Internet, a WiFi connection, infrared, and the like.

Figure 1:
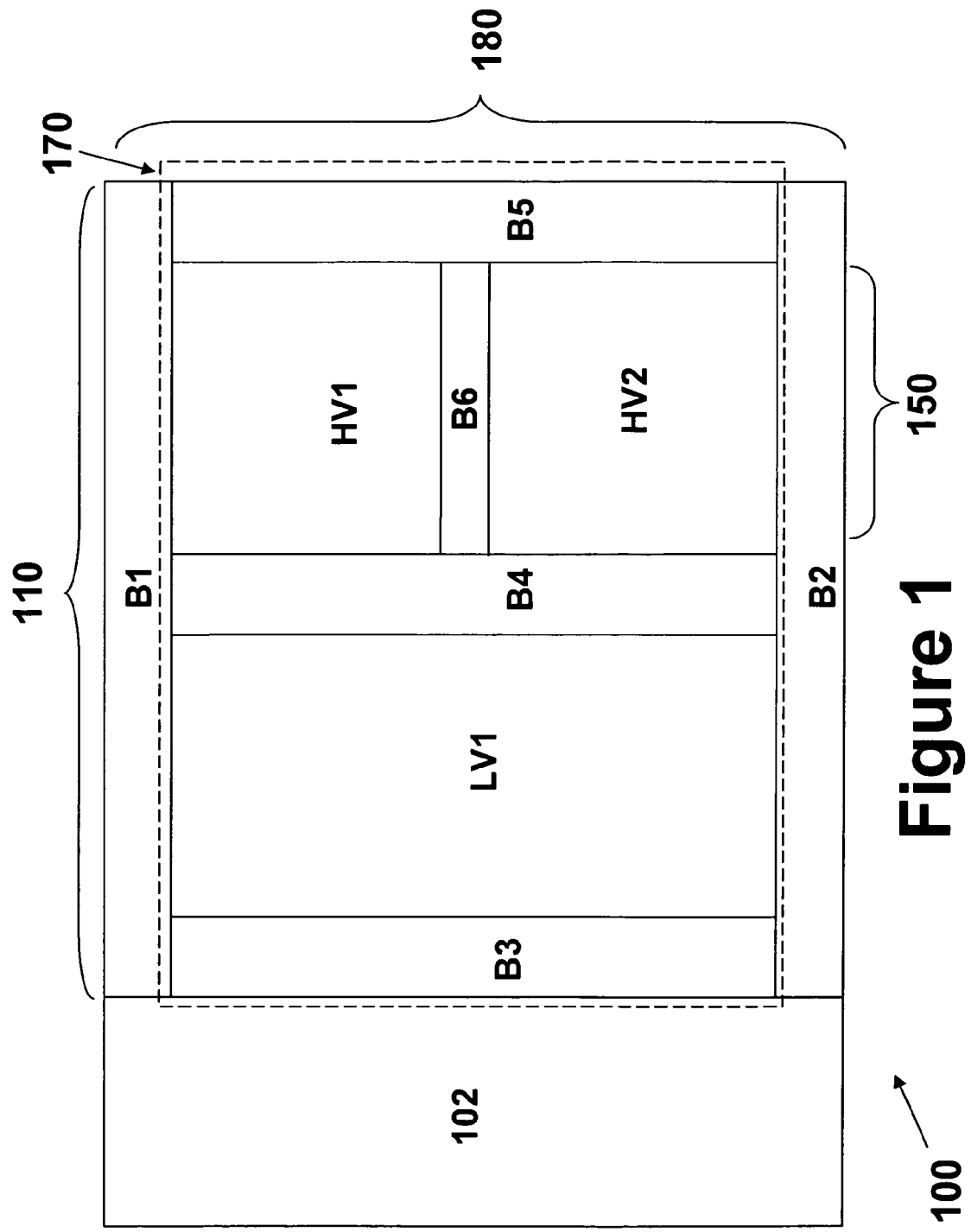
FIG. 1 illustrates an exemplary geometrical layout of a cross section of a transformer.

To better understand the present invention, a cross-sectional view of an exemplary transformer 100 is shown in FIG. 1. The transformer 100 comprises a transformer coil 110 consisting of a single low voltage winding LV1 and two high voltage windings HV1 and HV2 wound around a core 102. Surrounding the low voltage winding LV1 and the high voltage windings HV1 and HV2 are barriers B1-B6. The barriers B1-B6 insulate all of the windings LV1, HV1 and HV2 from each other and comprise insulating materials, such as resin, electrical glass, paper, and the like. The geometry or physical layout of the transformer coil 110 can be described using a hierarchical data model. The hierarchical data model includes an abstract component called a block to arrange barriers and windings either horizontally or vertically. A block can be either a horizontal block or a vertical block. A horizontal block or a vertical block can also include sub-blocks. Sub-blocks in a horizontal block can be arranged horizontally while sub-blocks in a vertical block can be arranged vertically. Other configurations may be adapted as well. A block can also contain barriers or windings. For example, in FIG. 1, vertical block 180 that defines the entire physical layout includes barriers B1 and B2 and horizontal block 170, and horizontal block 170 includes barrier B3, winding LV1, barrier B4, barrier B5, and vertical block 150. Vertical block 150 consists of winding HV1, barrier B6 and winding HV2.

The physical layout in FIG. 1 is described using the following general hierarchical data model:

EXAMPLE #1 vertical block 180
  barrier B1
  horizontal block 170
    barrier B3
    winding LV1
    barrier B4
    vertical block 150
      winding HV1
      barrier B6
      winding HV2
    barrier B5
  barrier B2

The first vertical block 180 in Example #1 defines the entire physical layout. Horizontal block 170 defines the middle section of the physical layout between the top and bottom barriers B1 and B2. Horizontal block 170 contains a sub-block 150 which is also described using the hierarchical data model. Within horizontal block 170 are barriers B3, B4, B5, the low voltage winding section LV1 as well as vertical block 150. Vertical block 150 contains high voltage windings HV1 and HV2 and barrier B6.

Figure 2:
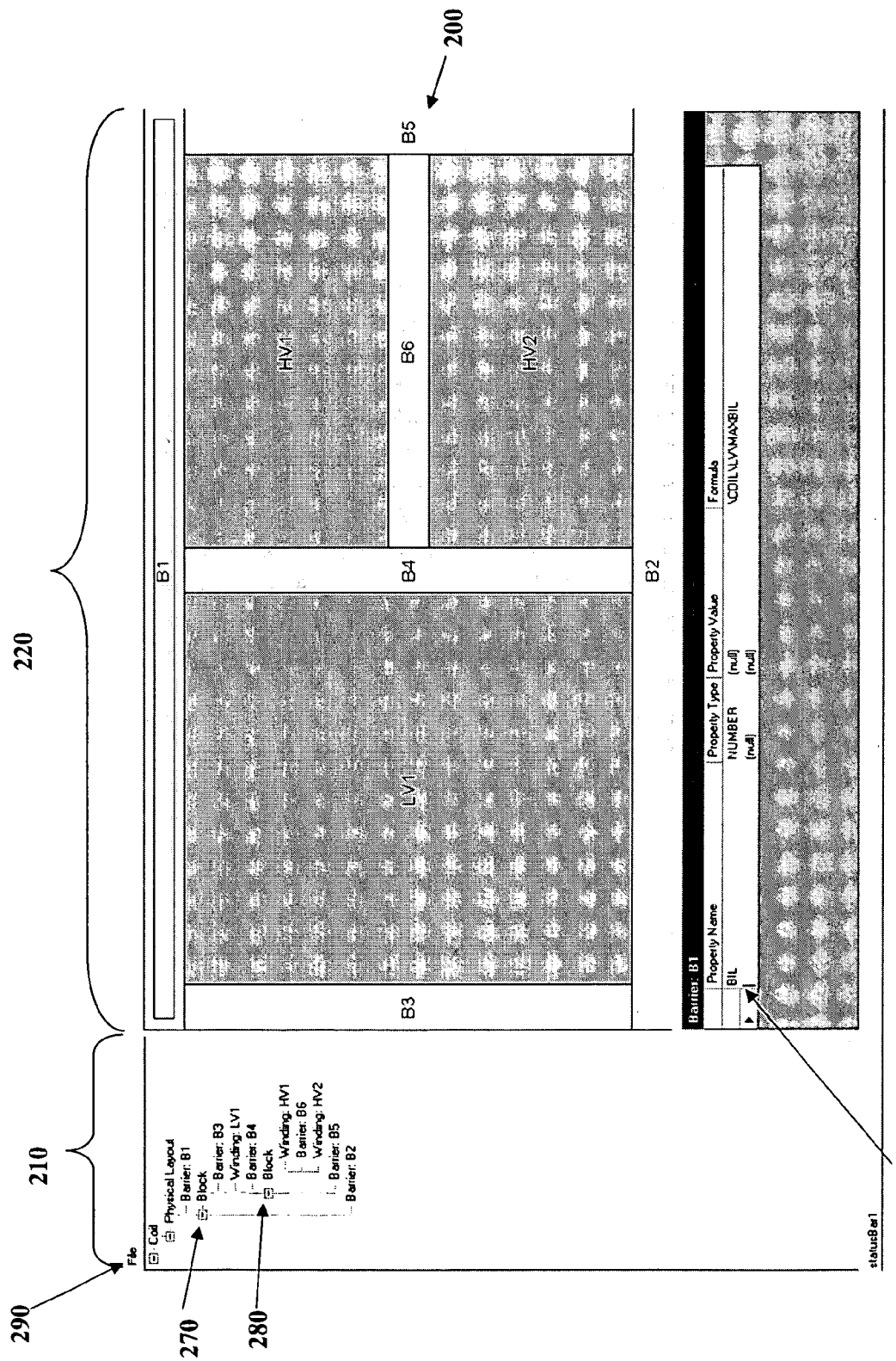
FIGS. 2-5 are views of graphical user interfaces for creating a metadata text file corresponding to a transformer coil.

Then, the designer uses a graphical user interface (GUI) to create a representation of the transformer coil 110. FIG. 2 displays a screen shot of a physical layout GUI 200 used with the present invention. In the left pane 210 a tree structure is shown that corresponds to the hierarchical data model of Example #1. Displayed in the right pane 220 is a graphical representation of the physical layout of the transformer coil 110. Each barrier or winding shown in the right pane 220 is displayed as a geometric shape. In the embodiment of FIG. 2, the barriers B1, B2, B3, B4, B5 and B6 are displayed as rectangles. Windings LV1, HV1 and HV2 are also displayed as rectangles. The characteristics of the shapes representing the barriers and windings include size, position, and orientation. These characteristics are stored in a file that is read by the transformer design tool when a barrier or winding is added by the transformer designer. As blocks, sub-blocks, barriers, and windings are added, the transformer design tool accesses the file to render an image in the right pane 220. The associated shape and size of the barrier or winding reflects the actual shape and proportion of the component in the assembled transformer 100.

When the physical design is initiated, the design tool displays in the left pane 210 only a single block identifier called "Physical Layout," and the right pane 220 contains no barriers, windings, or blocks. As each block, barrier, or winding is added in the left pane 210 by the transformer designer, the associated figure is added to the right pane 220 by the transformer design tool. The figures are positioned in the right pane 220 sequentially according to the geometry of the physical layout.

Initially to enter blocks into the left pane 210, the designer positions the mouse over the block identifier "Physical Layout" and right clicks the mouse. A drop down menu (not shown) is displayed querying the designer what is to be added. In the present invention, barriers, windings or blocks are options that the designer may select from this drop down menu. The transformer design tool makes the assumption that the design is being built (and subsequently displayed) from top to bottom and then left to right. By making this assumption, the tool determines that any blocks added in the first level of the hierarchy will be horizontal. Any sub-blocks within the horizontal block are displayed vertically, and any sub-blocks within the vertical block are displayed horizontally and so forth.

In the embodiment of FIG. 2, the Barrier B1 is added into the left pane 210 by right clicking on the identifier "Physical Layout" and selecting the add barrier function from the not shown dropdown menu. When the entry B1 is entered, the tool automatically adds the geometric shape that corresponds to barrier B1 into the right pane 220 and labels the shape. In this example, the first barrier B1 is a long rectangle by default because the transformer design tool assumes that the first barrier (B1) borders the top of both the low voltage and high voltage winding sections. As described previously, the information for the size, position and orientation for each block or sub-block is stored in the file accessed by the transformer design tool during this step.

Next, horizontal block 170 is added into the left pane 210 at 270. The transformer designer positions the mouse over "Barrier: B1" in the left pane and right clicks the mouse. From the not shown drop down menu, the designer selects the add function and automatically the identifier "Block" 270 is added into the left pane 210. Next, the designer adds the sub-blocks within the horizontal block 170 by right clicking the Block 270 identifier and adding Barrier B3 from the drop down menu as previously described above for adding barrier B1. The transformer design tool does not begin drawing the horizontal block 170 in the right pane 220 until the transformer designer adds the sub-blocks to the horizontal block 170.

After barrier B1 is added to horizontal block 170, the transformer design tool then adds the geometric shape that represents barrier B3 in the right pane 220 with its associated label. At this stage, the transformer design tool assumes that there is only one horizontal block which will be displayed taking up the majority of the displayable area in the right pane 220. Next the winding LV1 and barrier B4 are added in the left pane 210 by the designer and the geometric shapes and labels are added by the transformer design tool into the right pane 220.

When the horizontal block 170 contains a sub-block (in this instance the sub-block is vertical block 150), the sub-block identifier 280 representing the vertical block 150 is added by the transformer designer. As the windings HV1, HV2 and barrier B6 are added to the left pane 210 by the designer, their respective geometric shapes are added by the transformer design tool to the right pane 220. Next, the transformer designer adds barrier B5 to the left pane to complete horizontal block 170, and the geometric shape for barrier B5 is added by the transformer design tool to the right pane 220. After the final element barrier B2 is added to the left pane 210, the right pane 220 is updated with the geometric shape of barrier B2 by the transformer design tool. At this point, the physical representation of the transformer coil 110 is complete.

Additional information relating to the objects, in particular values for the properties attached to the objects, can be entered using the physical layout GUI 200. For instance, the designer assigns to the various properties a value which, as described above can be a numeric value, a text or an equation. For example to assign the BIL value of barrier B1, the designer left clicks on barrier B1 identifier in the left pane 210 and enters the formula into the attribute menu 250. As shown in the attribute menu 250, the formula for barrier B1 is defined by the text "\COIL\LV\MAXBIL," which is entered by the transformer designer. This formula is an example of assigning a specific property to the component. As shown in FIG. 2, the formula for the BIL value of barrier B1 is "MAXBIL," which is defined during the customer input phase and is stored hierarchically under the "Coil" in the "LV" (Low Voltage Winding) section of the design.

Alternatively, the formula for BIL for barrier B1 could be defined as "\COIL\HV\MAXBIL." In this example, the value "MAXBIL" is stored hierarchically under the "COIL" in the HV (High Voltage Winding) section of the design.

In another example, the transformer designer may decide that the BIL value for the outer barriers (B1 and B2) is to be half the maximum BIL value for the entire transformer. This assignment may be captured by entering the formula "\COIL\LV\MAXBIL/2" for barrier B1. This formula is interpreted by the transformer design tool as the property MAXBIL divided by 2. In yet another example, the formula for barrier B1 may be defined as "\COIL\LV\(MAXBIL−MINBIL)." A value for MINBIL is defined hierarchically under the object LV under object COIL. As part of the design process, the transformer designer determines which formula is to be used.

As mentioned above, one advantage of the present invention resides in the fact the designer can modify the value of a property without necessarily changing the transformer coil model template. For example, to change the value for MAXBIL the designer simply uses the tool to retrieve the present value for MAXBIL and enter a new value. Every modification can be saved by clicking on "File" at point 290 in the physical layout GUI 200 of FIG. 2 and a drop down menu will be displayed wherein there is a "Save As" command.

After the design is saved, the design tool creates a metadata text file representing the transformer coil 110 as defined in the physical layout GUI 200. The design tool extracts the information necessary to create the metadata text file from the information entered in the physical layout GUI 200. The transformer designer can preview the metadata file by clicking on the "View XML . . ." option in the drop down menu 255 represented in FIG. 3.

An exemplary metadata text file corresponding to the design information shown in FIG. 2 is given below in Example #2. Example #2 has blocks or objects and sub-blocks or sub-objects incorporating XML (eXtensible Markup Language), a metadata markup language.

EXAMPLE 2

```
<coil name="Coil">
    <physicalLayout layout="vertical">
        <barrier name="B1">
            <property name="BIL" type="NUMBER"
                value=""formula="\COIL\LV\MAXBIL" />
            <block layout="horizontal">
                <barrier name="B3" />
                <winding name="LV1" />
                <barrier name="B4" />
                <block layout="vertical">
                    <winding name="HV1">
                    <barrier name="B6" />
                    <winding name="HV2" />
                </block>
                <barrier name="B5" />
            </block>
            <barrier name="B2" />
```

-continued

```
            <property name="BIL" type="NUMBER"
                value=""formula="\COIL\LV\MAXBIL"/>
        </barrier>
    </physicalLayout>
</coil>
```

The metadata are arranged in a hierarchical format. The layers within the metadata file are analogous to the generations in a family tree. Within the metadata elements are element tags used by the transformer design tool to interpret the information contained in the metadata element. After reading and analyzing the element tags, the design tool extracts the design information as it relates to the transformer model template. The element tag describes different characteristics of the metadata element. In Example #2, the names of each of the metadata elements are shown enclosed within quotation marks. For barrier B1, the tag associated with its name is shown as '<barrier name="B1"/>.' For the BIL formula defined for barrier B1 in the attribute menu 250, the tag is shown as '<property name="BIL" type="NUMBER" value=""formula="\COIL\LV\MAXBIL"/>.' As shown in Example #2, the BIL formula for barrier B2 is the same as the BIL formula for barrier B1.

Then the designer configures the circuit layout of the transformer design. The top level of the transformer coil 110 is the entire circuit layout for the transformer coil 110. The next level of the hierarchy consists of the associated phase circuit for the low voltage section and the high voltage section of the coil 110. Located hierarchically under the phase circuit for each section are either the windings or the associated circuits. Beneath the hierarchy of the windings are the segments and under the segments are the start lead and the finish lead. Beneath the hierarchy of the associated circuits are the nodes and beneath each node is the source and destination of each node.

Figure 4:
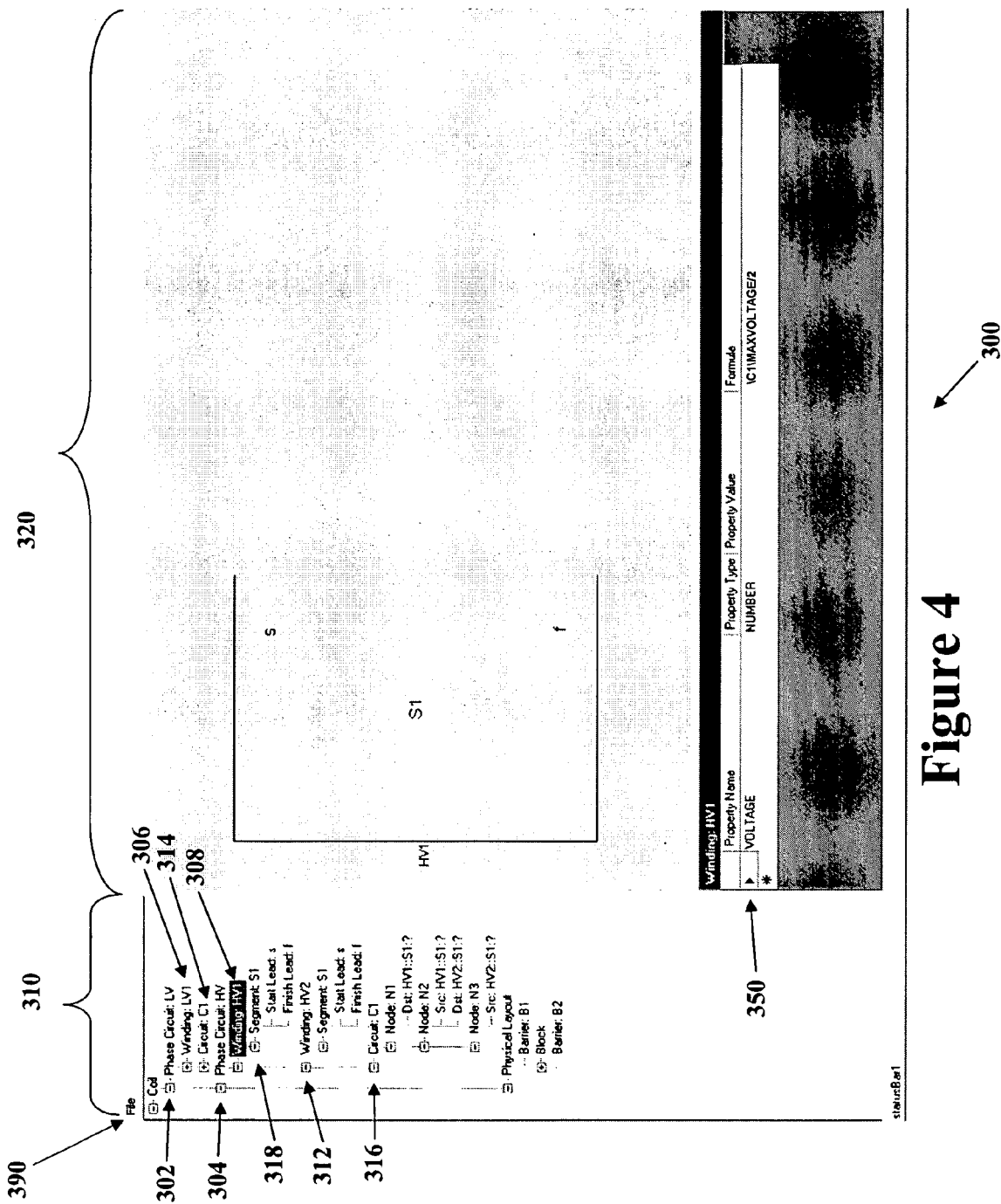
Figure 5:
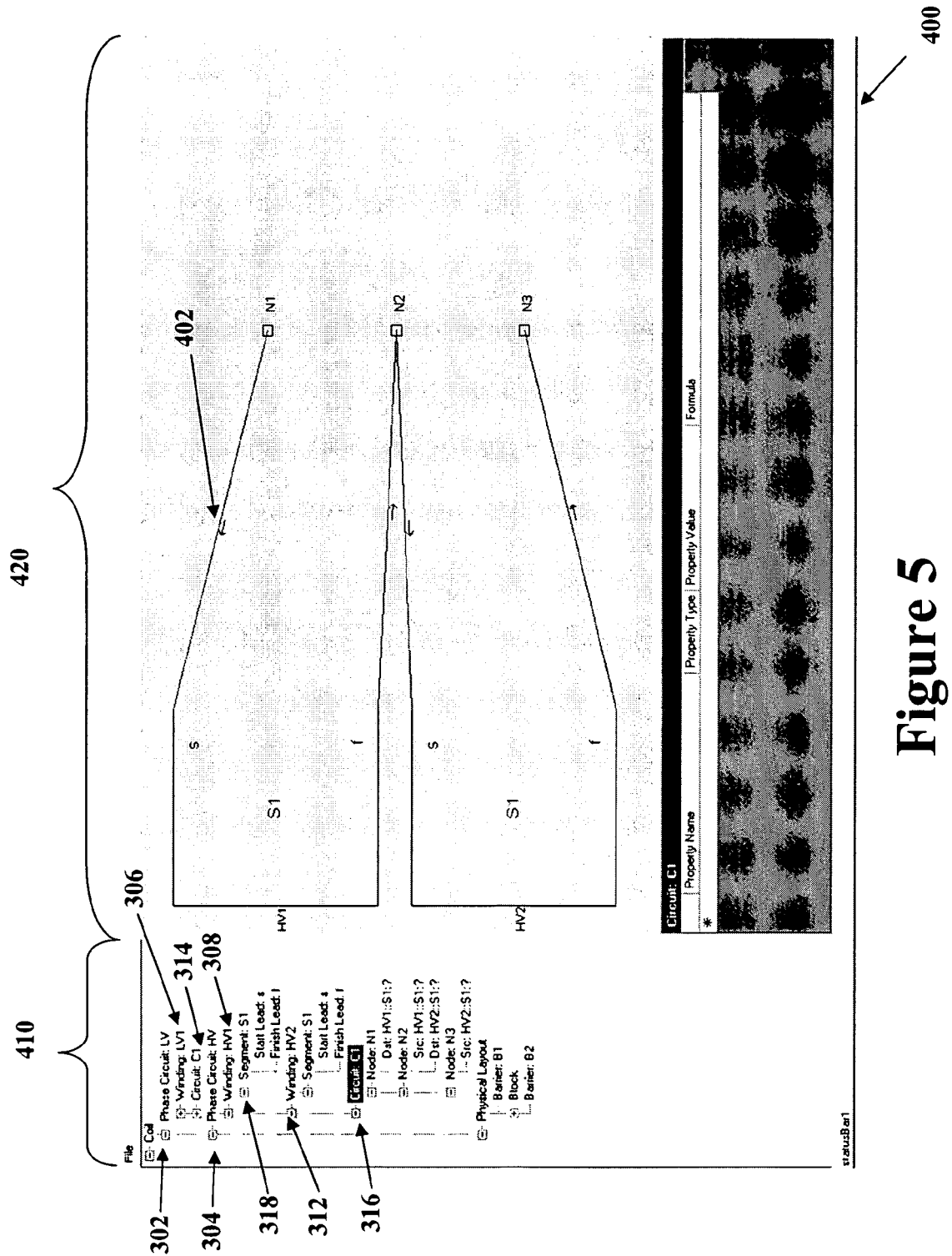

An exemplary GUI 300 used by the transformer designer to define the circuit layout is shown in FIGS. 4-5.

Figure 3:
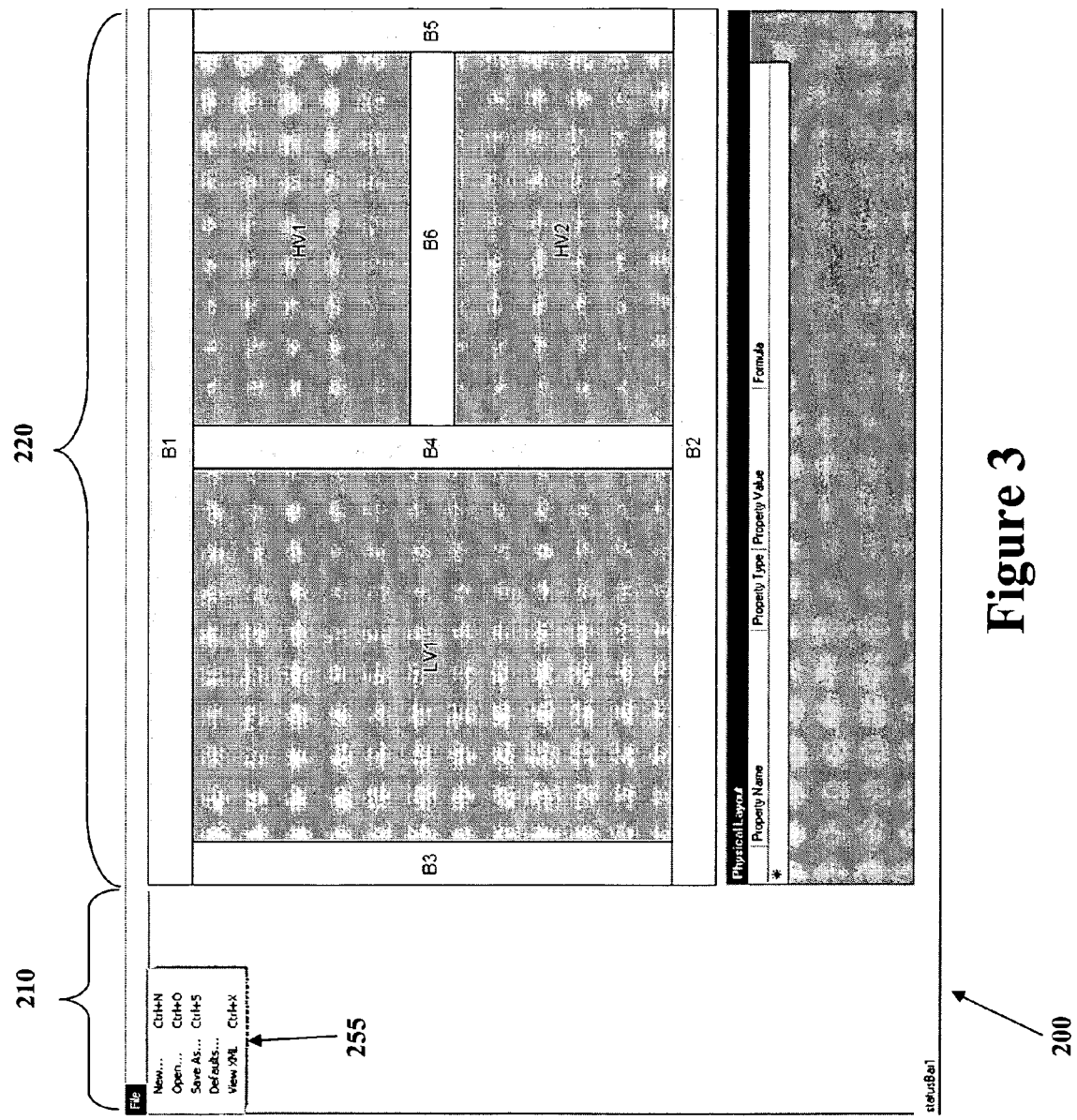

Similar to the GUI displayed in FIGS. 2 and 3, the GUI 300 of FIG. 4 comprises a left pane 310 and a right pane 320. In the left pane 310, the electrical configuration information is presented. In the right pane 320, a graphical representation of selected electrical configuration information is displayed.

The designer selects the GUI 300 from a pull down menu (not shown) within the transformer design tool. After the GUI 300 is displayed, the designer then selects the desired model template to edit from a pull down menu (not shown). The pull down menu for selecting the transformer model template may be similar to the pull down menu 255 (shown in FIG. 3) of the GUI 200. Next, the transformer design tool reads the physical layout metadata file associated with the selected transformer model template. The transformer design tool then extracts the basic winding information of the transformer coil 110.

As an illustrative example of the use of the transformer design tool to configure the electrical characteristics of the transformer coil, the designer selects the transformer model template that contains the physical layout metadata file of Example #2. After selection, the transformer model template is read and analyzed by the transformer design tool to determine the number of windings in the transformer design. After analyzing the associated transformer model template, the transformer design tool determines that there is one low voltage winding LV1 and two high voltage windings HV1, HV2 in the physical layout for the transformer design for Example #2. Based on the extracted physical layout information, the transformer design tool then populates the left pane 310 with a low voltage phase circuit 302 that has an associated low voltage winding LV1 306. The transformer design tool also adds a high voltage phase circuit 304 with associated high voltage winding HV1 308 and high voltage winding HV2 312. Beneath both phase circuits (302, 304), the electrical connection GUI 300 adds by default a low voltage circuit 314 and a high voltage circuit 316.

After the design tool has populated the left pane 310 with the electrical connection blocks (302-308, 312-316), the right pane 320 remains empty until the designer highlights one of the connection blocks (302-308, 312-316). As displayed in FIG. 4, the designer has highlighted the winding HV1 308. After highlighting the winding HV1 308, the transformer design tool populates the right pane 320 with the segment information for winding HV1.

Continuing with the exemplary design described herein, the segment S1 for winding HV1 is shown in the right pane 320. Segment S1 has a start lead s and a finish lead f. This is also displayed in the segment block 318 under the Winding HV1 308. By default, the design tool automatically populates any winding with one segment even though it is well known that a winding may have multiple segments. If the winding has more than one segment the designer can add those additional segments by right clicking on the block for that winding shown in the left pane 310. This displays a separate selection window (not shown) which allows the designer to specify the number of additional windings to be added. After the designer enters the number of windings to be added, the tool then displays the segments in the right pane 320 as well as the corresponding segment entries in the left pane 310.

After the designer has added all the segments for the particular winding section, the next task is to connect the nodes to the segments and define the flow of current through the transformer coil 110. To perform this task, the designer clicks on the circuit block 316 for the associated phase circuit 302, 304. When the designer clicks on circuit element 316, the GUI 400 of FIG. 4 is displayed. The left pane 410 of the GUI 400 displays the same information as shown in the left pane 310 of FIG. 3. However, in the right pane 420, the nodes for the high voltage section (windings HV1 and HV2) are displayed. The GUI 400 automatically displays at least one more node than the number of segments in the winding section. In this illustrative example the GUI 400 displays Nodes N1, N2 and N3.

The designer has the option of connecting the nodes N1, N2 and N3 in any configuration as is required in order to meet the customer requirements. In the embodiment of FIG. 4, the transformer designer connects the nodes N1, N2, and N3 in series. This connection is performed by first clicking and dragging N1 to the start lead s of segment S1 of winding HV1 in the right pane 420. By dragging node N1 to the start lead s, the designer is not only defining the electrical connection, but is also defining the direction of current flow. In this embodiment, Node N1 is assumed to be the node where current will start flowing into the windings. The flow of current from node N1 is shown by the arrow 402. Similarly, to configure the connection and current flow from finish lead f of segment S1 of winding HV1 to node N2, the designer clicks on the finish lead f and drags it to Node N2. This procedure is repeated to connect Node N2 to the start lead s of segment S1 of winding HV2 as well as to connect finish lead f of segment S1 of winding HV2 to node N3.

After the segments have been defined and connected, the designer can assign values to any of the properties attached to the various objects. For example, the designer can assign the maximum voltage characteristics of a particular winding. Another example of a property is a mathematical equation for determining the voltage for a particular winding as it relates to an entire winding section.

In this example, the two high voltage windings HV1 and HV2 are identical and are connected in series. Thus the voltage drop across each of the windings (HV1, HV2) is one-half the total voltage drop for the entire high voltage winding section. To make the voltage drop formula assignment for winding HV1, the designer clicks on the Winding HV1 block 308 and the GUI 300 of FIG. 3 is displayed. Displayed within the GUI 300 is the attribute menu 350. In the attribute menu 350 for winding HV1, the designer enters "\C1\MAXVOLTAGE/2." This is interpreted by the design tool as defining the voltage drop for winding HV1 as one-half the total drop across the high voltage section. In this example the value MAXVOLTAGE is defined during the customer input phase and is the nominal voltage assigned to the high voltage section of the winding.

If the transformer designer has determined that the voltage defined for the winding HV1 is a value defined as the difference between the nominal voltage and a customer defined minimum voltage, the designer assigns the formula: "C1\(MAXVOLTAGE−MINVOLTAGE)." The value of MINVOLTAGE can be assigned during a data input phase.

After all assignments are defined, the designer can save the model by selecting the save option from a pull down menu (not shown) activated by clicking on "File" at location 390 within the GUI 300.

Example #3 is an exemplary metadata text file that is generated by the transformer design tool from the information presented in the GUI 300 and 400 and added to the transformer model template.

EXAMPLE #3

```
<coil name="coil">
<phaseCircuit name="HV" layout="vertical">
  <winding name="HV1" orientation="right">
    <property name="VOLTAGE" type="NUMBER"
    value="" formula="\C1\MAXVOLTAGE/2"/>
      <segment name="S1">
   <startLead name="s" />
      <finishLead name="f" />
      </segment>
  </winding>
    <winding name="HV2" orientation="right">
      <property name="VOLTAGE" type="NUMBER"
      value="" formula="\C1\MAXVOLTAGE/2"/>
      <segment name="S1">
      <startLead name="s" />
      <finishLead name="f" />
      </segment>
    </winding>
  <circuit name="C1">
    <node name="N1">
      <dst name="HV1::S1:" segment="S1" winding="HV1" lead="s" />
    </node>
    <node name="N2">
      <src name="HV1::S1:" segment="S1" winding="HV1" lead="f" />
      <dst name="HV2::S1:" segment="S1" winding="HV2" lead="s" />
    </node>
    <node name="N3">
      <src name="HV2::S1:" segment="S1" winding="HV2" lead="f" />
    </node>
  </circuit>
</phaseCircuit>
```

If during the design process, the designer wants to edit a saved design, the designer determines which section of the transformer design to modify. Then using the design tool the designer edits that section. For example, if the designer determines that after the verification phase the physical layout data needs to be modified, the designer returns GUI 200. In the GUI 200, the transformer designer selects the "Open . . . " option from the pull down menu 255 (FIG. 3) by clicking on "File" at location 290. The transformer design tool then loads the file and displays the corresponding information in the left pane 210 and the right pane 220 of the GUI 200. The designer may then carry out the modifications needed. Then, the metadata file is updated and added to the model template.

Two more preferred examples of possible metadata text files for describing and managing properties of a transformer coil are given hereinafter. In particular, example #4 describes a phase circuit containing formulas where the various formulas refer to other properties and all properties are contained in the same object, namely the phase circuit LV. For instance, the phase circuit has a property called BIL. This is a numeric property with a value of 10. There are other properties such as B1 BIL, B2 BIL and B3 BIL that refer to BIL in their formulas. In addition, some properties are assigned with a text value, such as for example the voltage selector or the value selector. The properties assigned with text values relate to predetermined values. For instance, the property Voltage Selector is used to select a voltage from some components. The value of this property specifies the component that the voltage is to be selected from, in this case the voltage N1 or the nominal voltage NV. For example, Voltage refers to NV. NV is a place holder with an initial value of 0. At some point in the program NV will be set to some other values. When the voltage for the winding LV1 is retrieved, the computer will see that voltage refers to NV and will retrieve whatever value is associated with NV at that time. The same reasoning apply for the properties Amps and MaxAmps. Further, in example #4, the circuit C1 has a node N1 with a single destination and no source. This means that the node is connected to something outside the phase circuit and sends current to its destination which is the start lead of segment S1 of winding LV1. Node N2 has a single source which means that the current is coming from segment S1 of winding LV1 and goes to an external component.

EXAMPLE #4

```
<phaseCircuit name="LV" layout="vertical">
    <property name="B1 BIL" type="Number" value=""
    formula="BIL" />
    <property name="B2 BIL" type="Number" value=""
    formula="SLEADBILF * BIL"/>
    <property name="B3 BIL" type="Number" value=""
    formula="BIL" />
    <property name="B4 BIL" type="Number" value=""
    formula="SLEADBILF * BIL"/>
    <property name="SLEADBILF" type="Number" value="1" />
    <property name="LV1 BIL" type="Number" value=""
    formula="BILF * BIL" />
    <property name="BILF"type="Number"
    value=""formula="#(SLEADBILF-FLEADBILF)"/>
    <property name="FLEADBILF" type="Number" value="3" />
    <property name="BIL" type="Number" value="10" />
    <winding name="LV1" orientation="right">
        <property name="Voltage Selector" type="Text" value="N1" />
        <property name="Value Selector" type="Text" value="Max" />
        <property name="NV" type="Number" value="0" />
        <property name="Voltage" type="" value="" formula="NV" />
        <property name="MaxAmps" type="Number" value="0" />
        <property name="Amps" type="" value="" formula="MaxAmps" />
        <segment name="S1">
            <startLead name="s" />
```

-continued

```
            <finishLead name="f" />
        </segment>
    </winding>
    <circuit name="C1">
        <node name="N1">
            <dst name="LV1::S1" segment="S1" winding="LV1" />
        </node>
        <node name="N2">
            <src name="LV1::S1" segment="S1" winding="LV1" />
        </node>
    </circuit>
</phaseCircuit>
```

In the example #5 below, the phase circuit contains a winding named LV1. Winding LV1 has a property named MaxAmps and its formula is "parent\C1\MaxAmps". The word "parent" is a key word that refers to the parent of LV1. In this case the parent of LV1 is the phase circuit LV. Circuit C1 is another object contained in LV and it has a property called MaxAmps. It can be noticed that the circuit C1 does not have a property called MaxAmps. However, the MaxAmps property can be added to circuit C1 at runtime when needed. Indeed, regardless if a property is stated explicitly in the text file or added at runtime, the properties are always associated with an object and the formulas can be written to refer to them.

EXAMPLE #5

```
<phaseCircuit name="LV" layout="vertical">
    <property name="B1 BIL" type="Number" value="" formula="BIL" />
    <property name="B2 BIL" type="Number" value=""
    formula="SLEADBILF * BIL"/>
    <property name="B3 BIL" type="Number" value="" formula="BIL" />
    <property name="B4 BIL" type="Number" value=""
    formula="SLEADBILF * BIL"/>
    <property name="SLEADBILF" type="Number" value="1" />
    <property name="LV1 BIL" type="Number" value=""
    formula="BILF * BIL" />
    <property name="BILF" type="Number" value=""
    formula="#(SLEADBILF-FLEADBILF)"/>
    <property name="FLEADBILF" type="Number" value="3" />
    <property name="BIL" type="Number" value="10" />
    <winding name="LV1" orientation="right">
        <property name="MaxAmps" type="" value=""
        formula="parent\C1\MaxAmps" />
        <property name="MaxSerialAmps" type="Number" value="0" />
        <property name="Voltage" type="" value=""
        formula="parent\C1\MaxVoltage" />
        <property name="MaxParallelAmps" type="Number" value="0" />
        <segment name="S1">
            <startLead name="s" />
            <finishLead name="f" />
        </segment>
    </winding>
    <circuit name="C1">
        <node name="N1">
            <dst name="LV1::S1" segment="S1" winding="LV1" />
        </node>
        <node name="N2">
            <src name="LV1::S1" segment="S1" winding="LV1" />
        </node>
    </circuit>
</phaseCircuit>
```

As will be appreciated by one of ordinary skill in the art and as before mentioned, the present invention may be embodied as or take the form of the method previously described, a computing device or system having program code configured to carry out the operations, a computer program product on a computer-usable or computer-readable medium having computer-usable program code embodied in the medium. The computer-usable or computer-readable medium may be any medium that can contain, store, communicate, propagate, or transport the program for use by or in connection with the instruction execution system, apparatus, or device and may by way of example but without limitation, be an electronic, magnetic, optical, electromagnetic, infrared, or semiconductor system, apparatus, device, or propagation medium or even be paper or other suitable medium upon which the program is printed. More specific examples (a non-exhaustive list) of the computer-readable medium would include: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Computer program code or instructions for carrying out operations of the present invention may be written in Extensible Markup Language (XML) or any other suitable programming language provided it allows to achieve the previously described technical results. The program code may execute entirely on the user's computing device, partly on the user's computing device, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A physically tangible computer-readable medium having computer-readable instructions for performing a method of describing and managing properties of an electrical device, the method comprising:
   generating a graphical user interface (GUI);
   receiving information about components of the electrical device through the GUI;
   generating a metadata text file describing the electrical device using the received information, the metadata text file being written in a metamarkup language and comprising component elements describing the components of the electrical device, respectively, the component elements being arranged in a hierarchical format that corresponds to the physical arrangement of the components in the electrical device; and
   storing the generated metadata text file; and
   wherein the component elements comprise a first component element describing a first component of the electrical device and a second component element describing a second component of the electrical device, the first component element having first information associated therewith and the second component element having second information associated therewith, the first information describing a property of the first component and including a variable having a value located in the second information associated with the second component element; and
   wherein the electrical device comprises a transformer, the first component comprises a winding, and the first information in the first component element comprises a formula for determining the voltage drop across the winding.

2. The computer-readable medium of claim 1, wherein the method further comprises displaying the metadata text file in the GUI, and wherein the metamarkup language is extensible markup language (XML).

3. A physically tangible computer-readable medium having computer-readable instructions for performing a method of describing and managing properties of an electrical device, the method comprising:
   generating a graphical user interface (GUI);
   receiving information about components of the electrical device through the GUI;
   generating a metadata text file describing the electrical device using the received information, the metadata text file being written in a metamarkup language and comprising component elements describing the components of the electrical device, respectively, the component elements being arranged in a hierarchical format that corresponds to the physical arrangement of the components in the electrical device; and
   storing the generated metadata text file; and
   wherein the component elements comprise a first component element describing a first component of the electrical device and a second component element describing a second component of the electrical device, the first component element having first information associated therewith and the second component element having second information associated therewith, the first information describing a property of the first component and including a variable having a value located in the second information associated with the second component element; and wherein the second component element includes second information about a property of the second component, the second information comprising a formula for determining a value of the property, and wherein the formula in the first information and the formula in the second information utilize a common variable.

4. The computer-readable medium of claim 3, wherein the step of receiving information in the method comprises:
   making blocks available for selection through a menu in the GUI, the blocks corresponding to the component elements;
   receiving selections of the blocks, the selected blocks including first and second component blocks corresponding to the first and second component elements, respectively; and
   displaying block identifiers for the selected blocks in a screen of the GUI, the displayed block identifiers including first and second block identifiers for the first and second component blocks, respectively.

5. The computer-readable medium of claim 4, wherein the step of receiving information in the method further comprises:
   selecting the first block identifier displayed in the screen;
   in response to the selection of the first block identifier, displaying a table in the screen; and
   entering the first information about the property of the first component into the table.

6. The computer-readable medium of claim 4, wherein the metadata text file is a first metadata text file, and wherein the method further comprises generating a second metadata text file describing a circuit layout of the electrical device, the second meta data text file comprising circuit component elements describing electrical components in the circuit layout of the electrical device.

7. The computer-readable medium of claim 6, wherein the step of generating the second metadata text file comprises using the first metadata text file to automatically display circuit block identifiers in a screen of the GUI, the circuit block identifiers corresponding to the circuit component elements and being displayed in a tree showing a hierarchical association of the circuit block identifiers.

8. The computer-readable medium of claim 4, wherein the blocks are selected in a sequence corresponding to the physical arrangement of the electrical device.

9. The computer-readable medium of claim 8, wherein the block identifiers are displayed in a tree showing a hierarchical association of the block identifiers.

10. The computer-readable medium of claim 9, wherein the block identifiers are displayed as the blocks are selected, respectively.

11. A physically tangible computer-readable medium having computer-readable instructions for performing a method of forming a model of an electrical device, the method comprising:

generating a metadata text file describing the electrical device, the meta data text file being written in a metamarkup language and comprising component elements describing components of the electrical device, respectively, the component elements being arranged in a hierarchical format; and storing the generated metadata text file; and wherein the component elements comprise a first component element describing a first component of the electrical device and a second component element describing a second component of the electrical device, the first component element including first information about a property of the first component, the first information comprising a formula for determining a value of the property.

12. The computer-readable medium of claim 11, wherein the second component element includes second information about a property of the second component, the second information comprising a formula for determining a value of the property, and wherein the formula in the first information and the formula in the second information utilize a common variable.

13. The computer-readable medium of claim 12, wherein the electrical device comprises a transformer, the first component comprises a first high voltage winding, the second component comprises a second high voltage winding, the formula in the first information determines the voltage drop across the first high voltage winding, the formula in the second information determines the voltage drop across the second high voltage winding, and the common variable comprises the total voltage drop across both the first and second high voltage windings.

14. The computer-readable medium of claim 12, wherein the electrical device comprises a transformer, the first component comprises a first barrier, the second component comprises a second barrier, the formula in the first information determines the basic impulse level for the first barrier, the formula in the second information determines the basic impulse level for the second barrier, and the common variable comprises the total basic impulse level for the entire transformer.

15. The computer-readable medium of claim 11, wherein the method further comprises:

generating a graphical user interface (GUI); and displaying the metadata text file in the GUI; and wherein the metamarkup language is extensible markup language (XML).

* * * * *